(12) United States Patent
Yokomizo

(10) Patent No.: US 7,158,729 B2
(45) Date of Patent: Jan. 2, 2007

(54) OPTICAL RECEIVING DEVICE

(75) Inventor: Masaaki Yokomizo, Tokyo (JP)

(73) Assignee: NEC Corporation, Tokyo (JP)

( * ) Notice: Subject to any disclaimer, the term of this patent is extended or adjusted under 35 U.S.C. 154(b) by 742 days.

(21) Appl. No.: 10/329,834

(22) Filed: Dec. 27, 2002

(65) Prior Publication Data

US 2003/0123168 A1 Jul. 3, 2003

(30) Foreign Application Priority Data

Dec. 28, 2001 (JP) ............................. 2001-399707

(51) Int. Cl.
*H04B 10/06* (2006.01)
(52) U.S. Cl. .................... 398/202; 398/208; 398/209
(58) Field of Classification Search ................ 398/202, 398/208, 209, 213; 330/86, 110, 282, 308; 327/345
See application file for complete search history.

(56) References Cited

U.S. PATENT DOCUMENTS 5,777,507 A * 7/1998 Kaminishi et al. .......... 327/514
5,875,049 A * 2/1999 Asano et al. ............... 398/202
6,384,689 B1 * 5/2002 Kimura ...................... 330/308
6,476,660 B1 * 11/2002 Visocchi et al. ............ 327/336

FOREIGN PATENT DOCUMENTS

| JP | 07-235841 | 9/1995 |
| JP | 2000-252775 | 9/2000 |
| JP | 2000-312182 | 11/2000 |

* cited by examiner

*Primary Examiner*—Dalzid Singh
(74) *Attorney, Agent, or Firm*—Foley & Lardner LLP

(57) ABSTRACT

Provided is an optical receiving device which can achieve a wide dynamic range while keeping a constant extinction ratio against the changes in the input amplitude. A signal current of a light receiving element is converted to a signal voltage by an amplifier and the gain of the amplifier is regulated by a transistor. A DC voltage corresponding to the peak value of the signal current detected by a current detection circuit is outputted to a dummy current generating circuit. The resistance value of the transistor is controlled by a control voltage, which is outputted from an amplitude control circuit according to the difference between the DC voltage and a reference voltage, thereby to set the amplitude of the signal voltage converted by the amplifier to be invariable.

12 Claims, 8 Drawing Sheets

OPTICAL RECEIVING DEVICE

BACKGROUND OF THE INVENTION

1. Field of the Invention

The present invention relates to an optical receiving device used in a field of optical communication technology. In "Description of the Related Art" and "Description of the Preferred Embodiments" provided in the followings, as an example of such an optical receiving device, a burst signal optical receiver for receiving light signals from each subscriber in a PON (Passive Optical Network) system and the like will be described.

2. Description of the Related Art

In the ATM-PON (Asynchronous Transfer Mode based Passive Optical Network) as an economical high-speed broadband optical access system of next generation, the Optical Line Terminal (OLT) for storing a plurality of users on the network side and the Optical Network Unit (ONU) for terminating the subscriber lines on the user side are connected via optical fiber cables, and bi-directional transmission of signals are achieved by single-conductor fiber of 1.3 μm/1.5 μm wavelength multiplexing or double-conductor fiber of 1.3 μm wavelength.

The signal from the OLT is branched by an optical branching device and transmitted to the ONU provided on the user side. Also, control signals and the like are transmitted in the outgoing direction from the ONU to the OLT. Especially, in the outgoing direction, the signals are the burst signals in which signals are transmitted intermittently so that it is necessary for the optical receiver on the OLT side to be capable of receiving the burst signals.

Standardization of the ATM-PON is proposed by FSAN (Full Service Access Networks). For example, in the FSAN Class-B standard, an optical receiver is required to operate stably against the burst signals with the extinction ratio (or optical quenching; the level ratio of "0" level and "1" level) of 10 or less while keeping a wide dynamic range of more than 500 times as much, that is, the optical input current of 630 nAp-p to 320 μAp-p. In other words, it is necessary to have a sufficient bearing capacity for changes in the "0" level since the "0" level changes according to the changes (variation) in the optical input current. Further, the extinction ratio is set to be 10 or less so as to flow a certain amount of current (prebias current) to a laser diode even in the "0" level state (extinct) so that the state of the laser diode immediately reaches the "1" level (light:optical output) from the "0" level (extinct:no optical output )

FIG. 5 shows a circuit diagram showing a first conventional example of a burst signal optical receiver. In the followings, description will be provided with reference to FIG. 5.

In a conventional burst signal optical receiver 70, a preamplifier 71 is provided with an amplitude limiting function as a means for keeping a wide dynamic range. In other words, the preamplifier 71 comprises an amplifier 12 for converting signal current Ii outputted from a light receiving element 11 into a signal voltage Vo, a feedback resistor 14 connected between the I/O terminals of the amplifier 12, and a diode 72 which is connected in parallel to the feedback resistor 14. The amplifier 12, since its input impedance is substantially infinite and output impedance is substantially zero, operates as an inverting (or reversing) amplifier having an amplification factor corresponding to the resistance value of the feedback resistor 14.

The signal current Ii outputted from the light receiving element 11 is converted into the signal voltage Vo by the amplifier 12. More specifically the signal current Ii is inversion-amplified by the amplification factor corresponding to the resistance value of the feedback resistor 14 to be converted to the signal voltage Vo. At this time, the larger the amplification of the signal current Ii is, the larger the voltage drop in the feedback resistor 14 becomes. When the voltage drop in the feedback resistor 14 exceeds the built-in voltage of the diode 72, the diode 72 is on state. As described, by connecting the diode 72 in parallel to the feedback resistor 14 of the preamplifier 71, the amplitude of the signals can be limited to a specific value or less (see FIGS. 6[a] and 6[b]).

However, the FSAN standard allows the extinction ratio=10, which is the level ratio of the "1" level and "0" level. Thus, there faces a problem when, for example, a large signal of 10 times as much as the normal amount or more is inputted, the "0" level exceeds the amplification limit value so that all the output of the preamplifier 71 is fixed to the "1" level (see FIGS. 7[c] and 7[d]). In other words, it is not possible for the related art to keep the bearing capacity against the changes in the "0" level.

In order to overcome this problem, Japanese Patent Application Laid-open No. 2000-252775 discloses a burst signal optical receiver which can effectively suppress the waveform distortion even when a light signal with a large power level is inputted. FIG. 8 is a circuit diagram showing a burst signal optical receiver 100 (a second conventional example). In the followings, description will be provided with reference to FIG. 8.

A photodiode 101 receives a light signal L and converts it to a current signal Iin. A current mirror circuit 102 comprises PNP transistors TR1 and TR2. With the current mirror circuit 102, a collector current Imon of the PNP transistor TR2 is to be always equal to a collector current of the PNP transistor TR1, that is, the current signal Iin.

A transform impedance amplifier 103 converts the current signal Iin received and obtained in the photodiode 101 into the voltage signal. In between the input terminal and the output terminal of the transform impedance amplifier 103, a feedback resistor Rf in which a resistor R1 and a MOS transistor TR3 are connected in parallel is provided. The feedback resistor Rf is for determining the gain of the transform impedance amplifier 103 and the resistance value is determined by the parallel resistance of the resistance in between the drain and the source of the MOS transistor TR3 and the resistor R1. An inverting amplifier 104 inverts the output signal of the transform impedance amplifier 103 and outputs it as a voltage signal Vout to the outside.

A transform impedance amplifier 105 converts the collector current Imon of the PNP transistor TR2 into a voltage signal. A feedback resistor R2 is for determining the gain of the transform impedance amplifier 105 and the resistance value is set to be smaller than that of the resistor R1. An inverting amplifier 106 inversion-amplifies the output signal of the transform impedance amplifier 105.

A peak detection circuit 107 detects a peak value Vpd of the output signal of the inverting amplifier 106. A reset signal Reset is inputted to the peak detection circuit 107 from the outside so that the peak value Vpd is reset every time the burst signal ends. An operational amplifier 108 outputs a signal Vg to the gate of the MOS transistor TR3 according to the level of the peak value Vpd thereby to control the gate voltage of the transistor TR3.

Next, operation of the burst signal optical receiver will be described.

First, the photodiode 101 receives the light signal L and converts it to the current signal Iin. As a result, the current signal Iin becomes the collector current of the PNP transistor TR1 so that, in the collector of the other PNP transistor TR2 in the current mirror circuit 102, the monitor current Imon equal to the current signal Iin flows. The transform impedance amplifier 105 converts the monitor current Imon from the current mirror circuit 102 into the voltage signal. At this time, the polarity of the waveform outputted from the transform impedance amplifier 105 is inverted with respect to that of the waveform of the monitor current Imon inputted to the transform impedance amplifier 105. The gain of the transform impedance amplifier 105 defined by the resistance value of the feedback resistor R2 is set to such value that the output signal is not saturated even when a large signal is inputted. Thereby, the transform impedance amplifier 105 linearly amplifies the monitor current according to the amplitude of the monitor current Imon.

The inverting amplifier 106 inverts the output signal of the transform impedance amplifier 105. The peak detection circuit 107 detects the peak value Vpd of the signal outputted from the transform impedance amplifier 105 within 1 bit, and holds the peak value Vpd in the burst section defined by the reset signal Reset. The peak value Vpd held thereby is initialized by the reset signal Reset by every burst period.

An operational amplifier 108 inverts the output signal of the peak detection circuit 107 to the gate voltage Vg and supplies the gate voltage Vg to the gate of the MOS transistor TR3 composing the feedback resistor Rf. Thereby, the resistance value of the feedback resistor Rf becomes smaller as the gate voltage Vg increases and becomes larger as the gate voltage Vg decreases. The gate voltage Vg is obtained by inverting the voltage of the peak value Vpd and the peak value Vpd represents the amount of the monitor current Imon, that is, the current signal Iin. Therefore, the value of the feedback resistor Rf becomes smaller as the current signal Iin increases and, inversely, becomes larger as the current signal Iin decreases. Also, the resistance value of the feedback resistor Rf is initialized to the maximum value when the reset signal Reset is inputted.

On the other hand, the polarity of waveform outputted from the transform impedance amplifier 103 is inverted with respect to that of the outputted waveform of the current signal Iin, which is to be inputted to the transform impedance amplifier 103, as in the case of the waveform outputted from the transform impedance amplifier 105. When a large signal of current signal Iin is inputted to the transform impedance amplifier 103, the transform impedance amplifier 103 receives the current signal Iin under the maximum gain state so that the first bit signal reaches the saturated state. However, the large signal of current signal Iin is reflected to the monitor current Imon and is controlled so that the resistance value of the feedback resistor Rf immediately decreases. Therefore, normal output waveform can be achieved after the second bit on. Also, when a small signal of current signal Iin is inputted to the transform impedance amplifier 103, the small signal is reflected to the monitor current Imon and is controlled so that the resistance value of the feedback resistor Rf immediately increases (to the maximum value). Therefore, normal waveform is outputted from the first bit on. An inverting amplifier 104 inverts the output signal of the transform impedance amplifier 103 and outputs the signal voltage Vout.

As described, with the burst signal optical receiver 100, the gain of the transform impedance amplifier 103 for inputting the signal current Iin can be changed according to the power level of the light signal to be received. Therefore, even if the power level of the light signal L becomes large, a signal sequence without distortion can be obtained. On the other hand, even if the power level of the light signal L becomes small, a signal sequence with the necessary amplitude can be obtained.

However, the second conventional example faces the following problems.

(1) Let's discuss about a plurality of burst signal optical receiver. Each burst signal optical receiver 100 has a different property in regards to the relation between the voltage in between the gate/source and the resistance between the drain/source in the MOS transistor TR3 composing the feedback resistor Rf due to the property of the individual MOS transistor TR3. Thus, there may be cases where the gain change cannot precisely follow the change in the power of the light signal L thereby narrowing the dynamic range.

(2) In general, the input terminal voltage of the transform impedance amplifier 103 requires 0.8 V or more. Also, roughly 2 V of voltage is required for operating the photodiode 101. Further, 0.8 V or more is required for operating the current mirror circuit 102. Therefore, by totaling the voltages, the supply voltage Vcc mounts to 3.6 V or more. Thus, it is not possible to operate the burst signal optical receiver 100 by 3.3 V (TYP.) power supply, which is the main stream in the optical transmission products.

(3) The current mirror circuit 102 has a complicated configuration compared to that of the photodiode 101 so that it operates considerably slow. Thus, it is hard to achieve the operation of 155.52 M bit/sec, which is the optical transmission rate of the ATM-PON system, by the current mirror circuit 102.

SUMMARY OF THE INVENTION

An object of the present invention is to provide an optical receiving device which can achieve a wide dynamic range through precisely changing the gain in accordance with the changes in the power of the light signal.

The optical receiving device of the present invention comprises: a first amplifier for converting a signal current outputted from a light receiving element into a signal voltage; a first variable feedback resistor being connected in between I/O terminals of the first amplifier in which the resistance value changes in accordance with a first control voltage; a dummy current generating unit comprising a function of detecting the peak value of the signal current outputted from the light receiving element and outputting a DC voltage equal to the signal voltage which is obtained when a DC current equal to the peak value is converted by the first amplifier; and an amplitude control circuit for outputting the first control voltage so as to reduce the difference between the DC voltage outputted from the dummy current generating unit and the reference voltage.

It is preferable that the dummy current generating unit comprises: a current detection circuit for detecting the peak value of the signal current outputted from the light receiving element; and a dummy current generating circuit for generating a DC current equal to the peak value detected by the current detection circuit and for outputting a DC voltage equal to the signal voltage which is obtained when the DC current is converted by the first amplifier.

In the above-described optical receiving device of the present invention, a light signal is converted into a signal current by the light receiving element and the signal current is converted into a signal voltage by the first amplifier. On the other hand, the peak value of the signal current is detected in the current detection circuit. The dummy current generating circuit generates the DC current equal to the peak value of the signal current and outputs the DC voltage equal to the signal voltage which is obtained when the DC current is converted by the first amplifier. Then, the amplitude control circuit controls the resistance value of the first variable feedback resistor through outputting the first control voltage so as to reduce the difference between the DC voltage outputted from the dummy current generating circuit and the reference voltage. As a result, the gain can precisely change in accordance with the changes in the power of the light signal. Therefore, the amplitude of the signal voltage converted by the first amplifier becomes invariable even for the light signal with a wide range of power levels.

Specifically, for example, when the peak value of the signal current is large, the DC voltage outputted from the dummy current generating circuit increases so that the difference between the current voltage and the reference voltage becomes large. Thus, the amplitude control circuit outputs the first control voltage so as to reduce the difference, that is, to reduce the resistance value of first variable feedback resistor thereby to reduce the gain of the first amplifier.

Inversely, when the peak value of the signal current is small, the amplitude control circuit outputs the first control voltage so as to increase the resistance value of the first variable feedback resistor thereby to increase the gain of the first amplifier.

As described, by controlling the feedback resistance value of the first amplifier, the first amplifier operates in a region where the output voltage of the first amplifier does not saturate, that is, in a linear region. Further, the DC voltage outputted from the dummy current generating circuit is equal to the signal voltage which is obtained when the peak value of the signal current is converted by the first amplifier so that it becomes extremely precise.

As a result, with the optical receiving device of the present invention, the amplitude of the signal voltage converted by the first amplifier can become invariable with high precision even for the light signal with a wide range of power levels.

As the first variable feedback resistor provided in the optical receiving device of the present invention, it is possible to use a transistor in which the first control voltage is applied to the gate or the base.

In the optical receiving device of the present invention, it is possible for the current detection circuit to comprise: a first resistor to which a signal current outputted from the light receiving element flows; a first current detection amplifier for amplifying both-end voltage of the first resistor; and a peak value detector for detecting the peak value of the voltage amplified by the first current detection amplifier.

Also, in the optical receiving device of the present invention, it is possible for the dummy current generating circuit to comprise: a variable current generator for outputting a current corresponding to a second control voltage as the DC current; a second amplifier with the same I/O property as that of the first amplifier for converting the DC current outputted from the variable current generator into a voltage and outputs it as the DC voltage; a second variable feedback resistor with the same I/O property as that of the first variable feedback resistor, in which the resistance value changes in accordance with a first control voltage by being connected in between I/O terminals of the second amplifier; a second resistor with the same I/O property as that of the first resistor, into which the DC current outputted from the variable current generator flows; a second current detection amplifier for amplifying both-end voltage of the second resistor; and an operational amplifier for outputting the second control voltage so as to reduce the difference between the voltage amplified by the second current detection amplifier and the peak value of the voltage detected by the peak value detector.

Also, in the optical receiving device of the present invention, the second amplifier, the second variable feedback resistor and the second resistor together forming the dummy current generating circuit can be formed to have the same configuration as that of the first amplifier, the first variable feedback resistor and the first resistor. As a result, the DC voltage outputted from the dummy current generating circuit becomes substantially equal to the signal voltage which is obtained when the peak value of the signal current is converted by the first amplifier. Therefore, the amplitude of the signal voltage converted by the first amplifier can become invariable with higher precision.

As the second variable feedback resistor provided in the optical receiving device of the present invention, it is possible to use a transistor in which the first control voltage is applied to the gate or the base.

As the variable current generator provided in the optical receiving device of the present invention, it is possible to use a transistor in which the second control voltage is applied to the gate or the base.

In the optical receiving device of the present invention, it is possible for the amplitude control circuit to comprise: a third amplifier, with the same I/O property as that of the first amplifier, for converting a current at the time of no signal into a voltage at the time of no signal; a third variable feedback resistor with the same I/O property as that of the first variable feedback resistor, in which the resistance value changes in accordance with a first control voltage by being connected in between I/O terminals of the third amplifier; a third resistor with the same I/O property as that of the first resistor, into which the current at the time of no signal flows; a level-shift circuit for shifting the voltage at the time of no signal, which is converted by the third amplifier, for a prescribed level so as to output it as the reference voltage; and an operational amplifier for outputting the first control voltage so as to reduce the difference between the reference voltage outputted from the level-shift circuit and the DC voltage outputted from the dummy current generating circuit.

Also, in the optical receiving device of the present invention, the third amplifier, the third variable feedback resistor and the third resistor together forming the amplitude control current generating circuit can be formed to have the same configuration as that of the first amplifier, the first variable feedback resistor and the first resistor. As a result, the voltage at the time of no signal obtained from the first amplifier becomes substantially equal to the voltage at the time of no signal which is obtained when the current at the time of no signal is converted by the first amplifier. Therefore, the reference voltage obtained by the amplitude control circuit becomes extremely precise so that the amplitude of the signal voltage converted by the fist amplifier can become invariable with high precision.

Further, it is possible for the amplitude control circuit to comprise: a third amplifier, with the same I/O property as that of the first amplifier, for converting a current at the time of no signal into a voltage at the time of no signal; a fixed feedback resistor connected in between I/O terminals of the third amplifier; a third resistor with the same I/O property as that of the first resistor, into which the current at the time of no signal flows; a level-shift circuit for shifting the voltage at the time of no signal, which is converted by the third amplifier, for a prescribed level so as to output it as the reference voltage; and an operational amplifier for outputting the first control voltage so as to reduce the difference between the reference voltage outputted from the level-shift circuit and the DC voltage outputted from the dummy current generating circuit.

In the optical receiving device of the present invention, it is possible for the amplitude control circuit to comprise an operational amplifier for outputting the first control voltage so as to reduce the difference between the reference voltage and the DC voltage outputted from the dummy current generating circuit.

As the third variable feedback resistor provided in the optical receiving device of the present invention, it is possible to use a transistor in which the first control voltage is applied to the gate or the base.

Further, in the optical receiving device of the present invention, the first amplifier, the first variable feedback resistor, the dummy current generating unit and the amplitude control circuit can be formed on the same semiconductor chip. On the same semiconductor chip, each element described above is formed at the same time, of the same material and manufacturing method. Therefore, the parts having the same configuration and property are easily achieved.

In short, in the present invention, by generating the current with the current value equivalent to the amplitude value of the input signal and the voltage with the voltage value equivalent to the output voltage of the preamplifier at the time of no signal, the feedback resistance value of the preamplifier is controlled using the obtained current and the voltage. Thereby, it is possible to control to obtain a desired output of the preamplifier on the basis of the output voltage of the preamplifier at the time of no signal, which cannot be detected when receiving the signal. In other words, changes in the current source and temperatures are balanced thereby achieving the stable operation. The distinctive features of the present invention are as follows. (1) By controlling the feedback resistance value of the preamplifier, it can be operated in the region where the preamplifier is not saturated, that is, in the linear region. (2) By generating each of the current with the current value equivalent to the amplitude value of the input signal and the voltage with the voltage value equivalent to the output voltage of the preamplifier at the time of no signal, the feedback resistance value of the preamplifier is controlled using the obtained current and the voltage. (3) The configuration of the circuit for generating the above-described current and the voltage, which are used for controlling the feedback resistance value of the preamplifier, is the same as that of the preamplifier.

BRIEF DESCRIPTION OF THE DRAWINGS

FIG. 2A shows a signal current Ii, FIG. 2B shows a signal voltage Vo, FIG. 2C shows a voltage V1, FIG. 2D shows DC current Ip, and FIG. 2E shows DC voltage Vp;

FIG. 6A shows a signal current Ii when a small signal is inputted and FIG. 6B shows a signal voltage Vo when a small signal is inputted;

FIG. 7C shows a signal current Ii when a large signal is inputted and FIG. 7D shows a signal voltage Vo when a large signal is inputted.

DETAILED DESCRIPTION OF THE PREFERRED EMBODIMENTS

Figure 1:
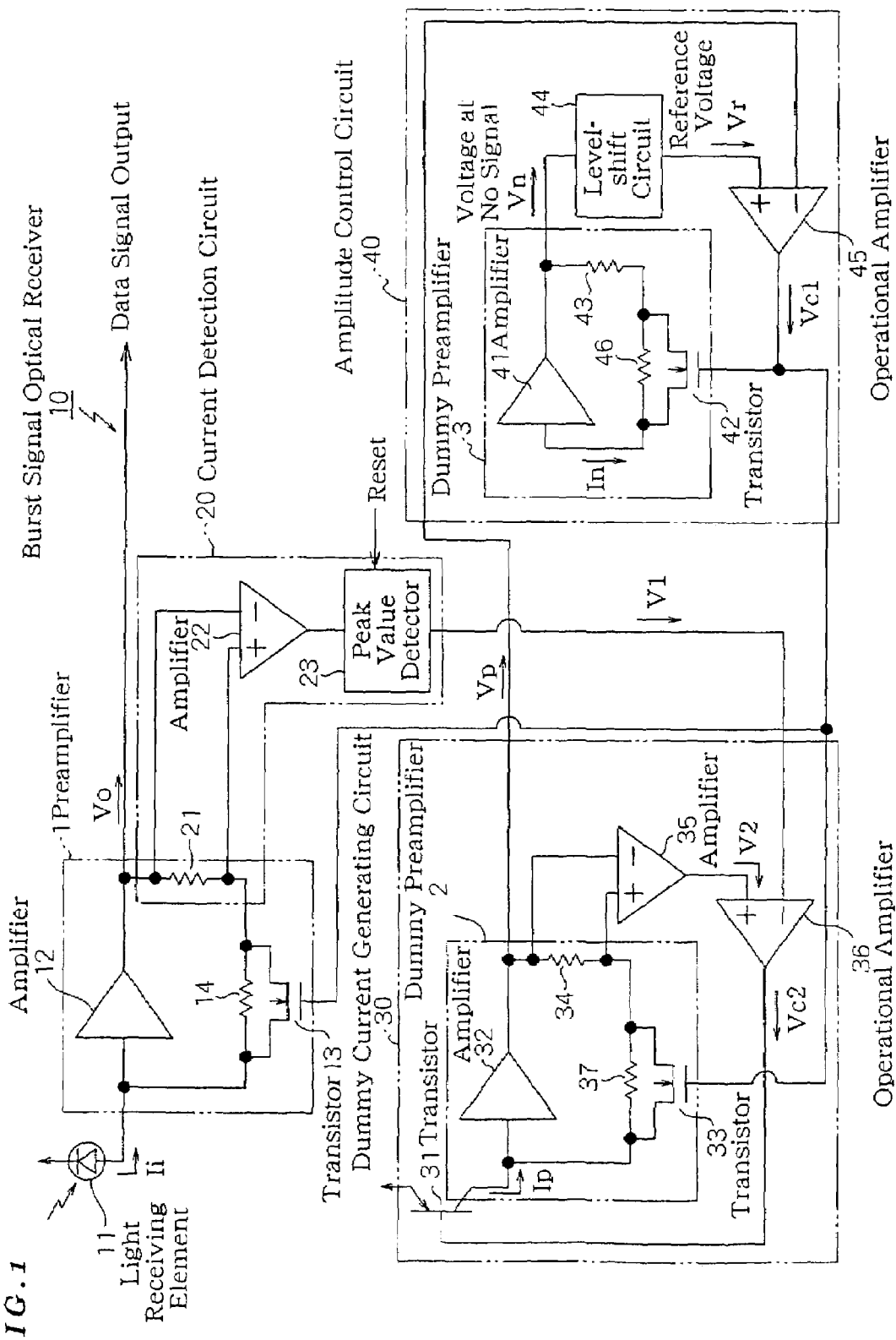
FIG. 1 is a circuit diagram showing a first embodiment of a burst signal optical receiver according to the present invention.

FIG. 1 is a circuit diagram showing a first embodiment of a burst signal optical receiver according to the present invention. It will be described in the followings by referring to FIG. 1.

A burst signal optical receiver (optical receiving device) 10 according to the present embodiment comprises: an amplifier (a first amplifier) 12 for converting a signal current Ii outputted from a light receiving element 11 into a signal voltage Vo; a transistor 13 as a first variable feedback resistor, being connected in between the I/O terminals of the amplifier 12, for regulating the gain of the amplifier 12; a current detection circuit 20 for detecting the peak value of the signal current Ii outputted from the light receiving element 11; a dummy current generating circuit 30 for generating a DC current Ip equal to the peak value detected by the current detection circuit 20 and for outputting the DC voltage Vp equal to the signal voltage Vo which is obtained when the DC current Ip is converted by the amplifier 12; and an amplitude control circuit 40 for controlling the resistance value of the transistor 13 through outputting a control voltage (a first control voltage) Vc1 according to the difference between the DC voltage Vp outputted from the dummy current generating circuit 30 and the reference voltage Vr so that the amplitude of the signal voltage Vo to be converted by the amplifier 12 becomes invariable. The transistor 13 comprises an n-channel type MOS transistor in which the control voltage Vc1 is applied to the gate. Further, the transistor 13 is an enhancement type so that a resistor 14 is connected between the source and drain.

The current detection circuit 20 comprises: a resistor (a first resistor) 21 into which the signal current Ii outputted from the light receiving element 11 flows; a current detection amplifier (a first current detection amplifier) 22 for amplifying the both-end voltage of the resistor 21; and a peak value detector 23 for detecting the peak value of the voltage amplified by the current detection amplifier 22. A reset signal Reset is inputted to the peak value detector 23 from outside so that the peak value held by the peak value detector 23 is reset every time the burst signal ends.

The dummy current generating circuit 30 comprises: a transistor 31 as a variable current generator for outputting current as the DC current Ip according to a control voltage Vc2; an amplifier (a second amplifier) 32, with the same I/O property as that of the amplifier 12, for converting the DC current Ip outputted from the transistor 31 into a voltage so as to output it as the DC voltage Vp; a transistor 33 as a second variable feedback resistor with the same I/O property as that of the transistor 13, which is connected in between the I/O terminals of the amplifier 32 and for regulating the gain of the amplifier 32 according to the control voltage Vc1; a resistor (a second resistor) 34 with the same I/O property as that of the resistor 21, into which the DC current Ip outputted from the transistor 31 flows; a current detection amplifier (a second current detection amplifier) 35 for amplifying the both-end voltages of the resistor 34; and an operational amplifier (an operational amplifier of the dummy current generating circuit) 36 for controlling the DC current Ip outputted from the transistor 31 to be equal to the peak value of the signal current Ii detected by the current detection circuit 20 through outputting a control voltage (a second control voltage) Vc2 according to the difference between the voltage V2 amplified by the current detection amplifier 35 and the peak value of the voltage V1 detected by the peak value detector 23. Further, the transistor 33 is an enhancement type so that a resistor 37 with the same I/O property as that of the resistor 14 is connected in between the source and drain of the transistor 33. The transistor 31 comprises a pnp-type bipolar transistor in which the control voltage Vc2 is applied to the base.

An amplitude control circuit 40 comprises: an amplifier (a third amplifier) 41 with the same I/O property as that of the amplifier 12 for converting a current In at the time of no signal into a voltage Vn at the time of no signal; a transistor (a third variable feedback resistor) 42 with the same I/O property as that of the transistor 13, which is connected in between the I/O terminals of the amplifier 41 for regulating the gain of the amplifier 41 based on the control voltage Vc1; a resistor (a third resistor) 43 with the same I/O property as that of the resistor 21, into which the current In at the time of no signal flows; a level-shift circuit 44 for shifting the voltage Vn at the time of no signal converted by the amplifier 41 for a prescribed level so as to output it as the reference voltage Vr; and an operational amplifier (an operational amplifier of the amplitude control circuit) 45 for outputting the control voltage Vc1 according to the difference between the reference voltage Vr outputted from the level-shift circuit 44 and the DC voltage Vp outputted from the amplifier 32. Further, the transistor 42 is an enhancement type so that a resistor 46 with the same I/O property as that of the resistor 14 is connected between the source and the drain of the transistor 42.

The amplifier 12, the transistor 13, and the resistors 14 and 21 form a preamplifier 1. The amplifier 32, the transistor 33, and the resistors 37 and 34 form a dummy amplifier 2. Further, the amplifier 41, the transistor 42, and the resistors 46 and 43 form a dummy amplifier 3. Each of the preamplifier 1, the dummy amplifiers 2 and 3 are transform impedance type with the same structure. Thus, each has the same I/O property.

Figure 2:
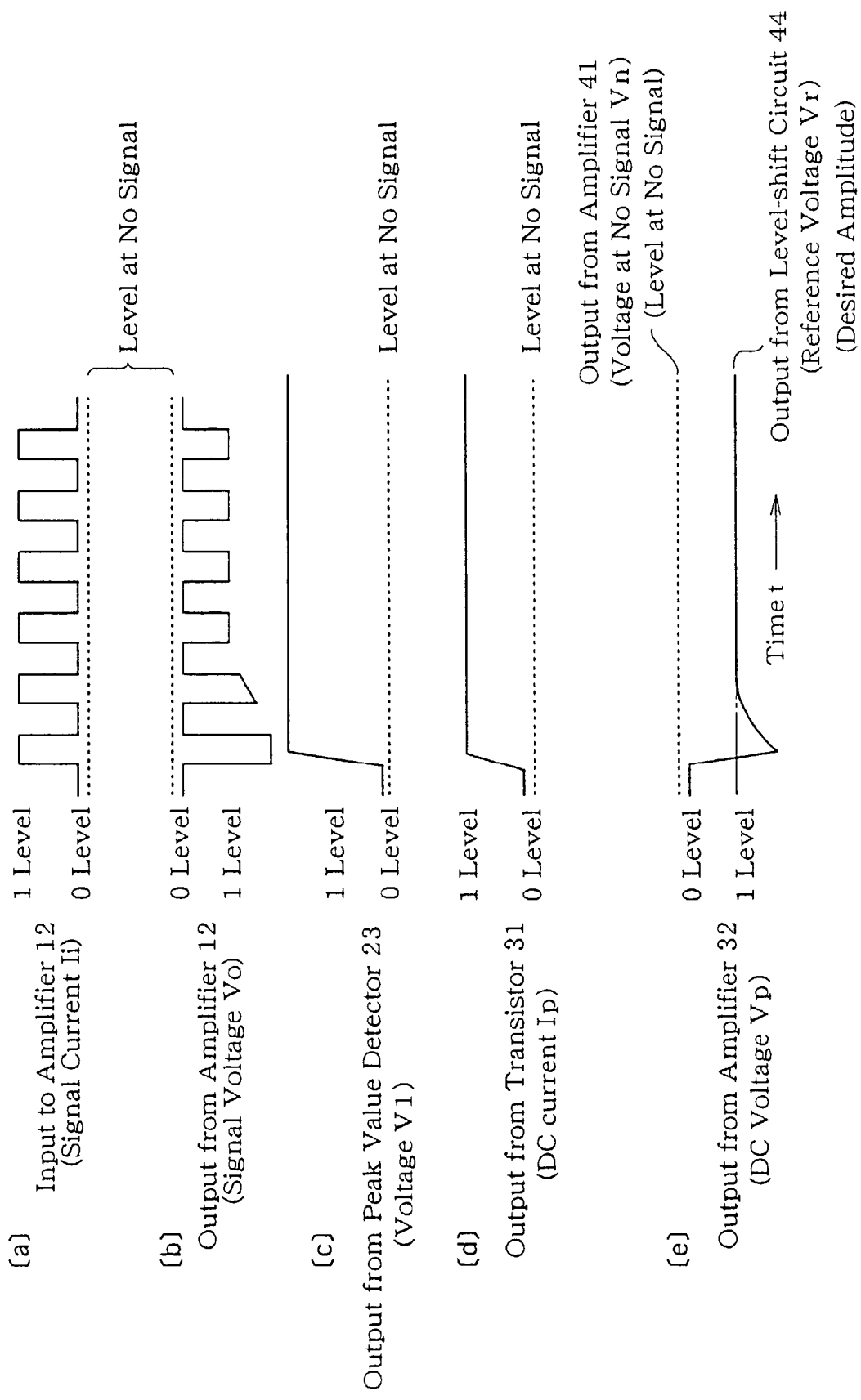
FIG. 2 are timing charts showing an example of operation in the burst signal optical receiver shown in FIG. 1, where

FIGS. 2 are timing charts showing an example of operation of the burst signal optical receiver 10. In the followings, the operation of the burst signal optical receiver 10 will be described by referring to FIG. 1 and FIGS. 2.

The signal current Ii (FIG. 2[a]) outputted from the light receiving element 11 which converts an optical data signal to an electric signal is converted (inversion-amplified) into the signal voltage Vo (data signal output) (FIG. [b]) by the amplifier 12. A current which is equal to the signal current Ii flowing in the light receiving element 11 flows into the resistor 21. Therefore, through, by the peak value detector 23, detecting the peak value of the voltage obtained by amplifying the both-end voltage of the resistor 21 by the current detection amplifier 22, the amplitude (voltage V1) (FIG. 2[c]) of the inputted data signal can be obtained.

The dummy amplifier 2 has substantially the same structure as that of the preamplifier 1. In other words, the amplifier 12 and the amplifier 32 have the same circuit, the resistor 14 and the resistor 37 have the same resistance value, the resistor 21 and the resistor 31 have the same resistance value, the transistor 13 and the transistor 33 have the same property, and the current detection amplifier 22 and the current detection amplifier 35 have the same circuit, except that, in the dummy preamplifier 2, the transistor 31 is connected instead of the light receiving element used in the preamplifier 1.

The dummy current amplifier 30 operates as follows. The DC current Ip (FIG. 2[d]) flowing in the transistor 31 is converted into the voltage V2 in proportion to the amplitude value of the DC current Ip by the resistor 34 and the current detection amplifier 35. The operational amplifier 36 amplitudes the differential voltage between the voltage V2 outputted from the current detection amplifier 35 and the voltage V1 outputted from the peak value detector 23 and performs a negative feedback of the amplified voltage to the base of the transistor 31. Thereby, the DC current Ip flowing in the collector of the transistor 31 is controlled to be equal to the peak value of the signal current Ii flowing in the light receiving element 11. Thus, the amplifier 32 outputs the DC voltage Vp (a solid line in FIG. 2[e]) equal to the amplitude of the signal voltage Vo outputted from the preamplifier 1.

The dummy amplifier 3 has substantially the same structure as that of the preamplifier 1. In other words, the amplifier 12 and the amplifier 41 have the same circuit, the resistor 14 and the resistor 46 have the same resistance value, and the resistor 21 and the resistor 43 have the same resistance value, the transistor 13 and the transistor 42 have the same property, except that, in the dummy amplifier 3, a current corresponding to the signal current Ii is not applied to the input terminal of the amplifier 41.

The amplitude control circuit 40 operates as follows. The current corresponding to the signal current Ii is not applied to the input terminal of the amplifier 41 so that the voltage Vn at the time of no signal (a dashed line in FIG. 2[e]) equal to the voltage outputted from the amplifier 12 at the time of no signal is generated. The voltage Vn at the time of no signal is level-shifted for a prescribed amount by the level-shift circuit 44 to be the reference voltage Vr (a single-dotted chain line). The operational amplifier 45 amplitudes the differential voltage between the DC voltage Vp outputted from the amplifier 32 and the reference voltage Vr to be the control voltage Vc1 and performs a negative feedback of the control voltage Vc1 to the gate terminals of the transistors 13, 33, and 42. In other words, the control voltage Vc1 controls the on-resistance value of the transistors 13, 33, and 42 so that the peak value of the DC voltage Vp, that is, the signal voltage Vo equals to the reference voltage Vr.

If the DC voltage Vp becomes lower than the reference voltage Vr, the output amplitude of the preamplifier 1 is to be over the desired value. Thus., until it reaches the desired amplitude, the gate voltage of the transistors 13, 33 and 42 is increased thereby to reduce the on-resistance value. As shown in the figure, the signal voltage Vo coincides with the reference voltage Vr, for example, in several bits. As described, through setting the amplitude, which is regulated by the amount of level shift, to be the level by which the amplifier 12 saturates or less, the amplifier 12 is to always operate in the linear region. As a result, it becomes possible to widen the dynamic range while keeping the invariable extinction ratio against the changes in the input amplitude.

Figure 8:
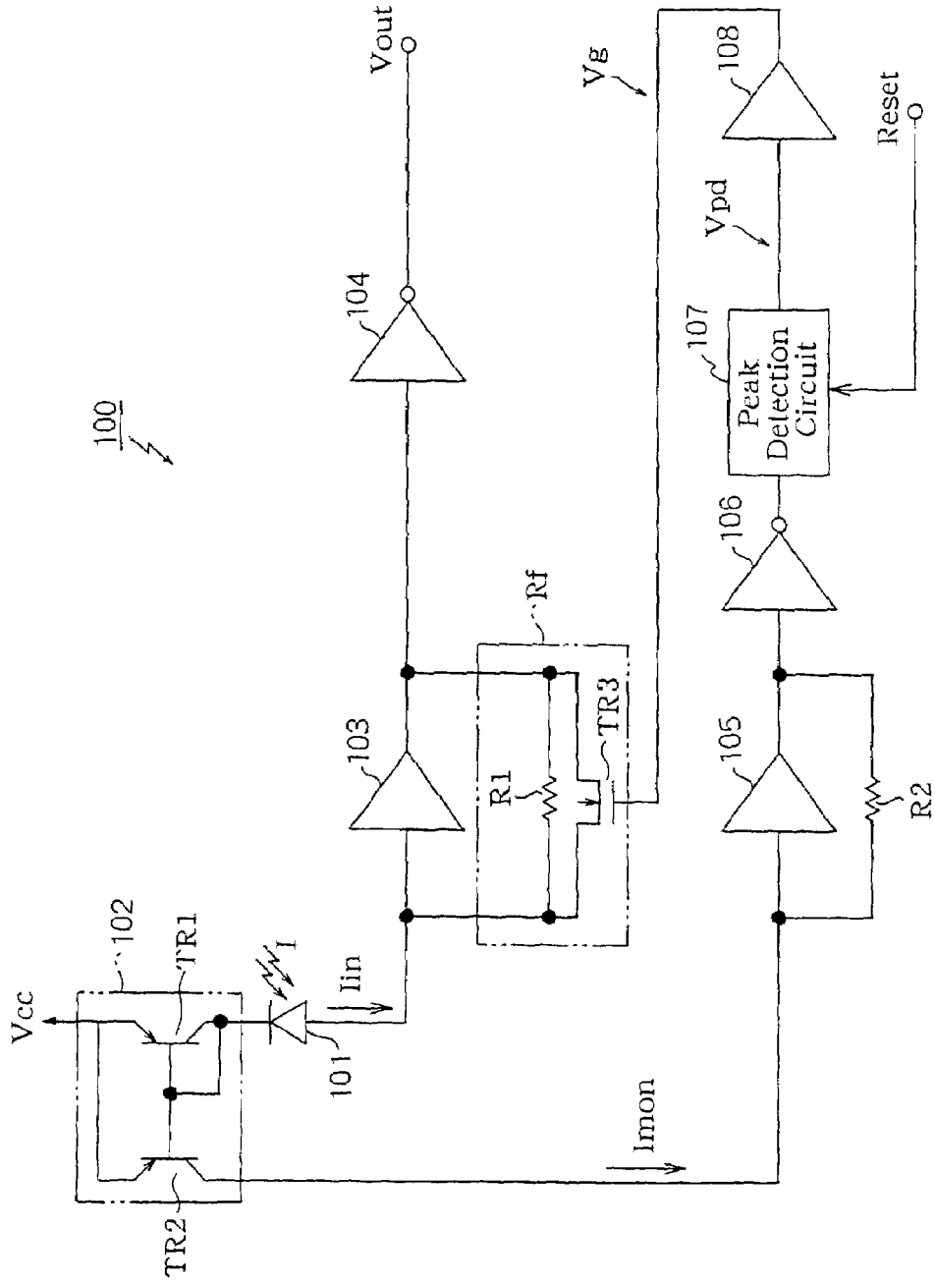
FIG. 8 is a circuit diagram showing a second conventional example of a burst signal optical receiver.

Next, the embodiment and a second conventional example will be compared with reference to FIG. 1 and FIG. 8.

(1) In the second conventional example, each burst signal optical receiver 100 has a different property in regards to the relation between the gate—source voltage and the drain— source resistance in the MOS transistor TR3 foaming the feedback resistor Rf. Therefore, there may be cases where the gain change cannot precisely follow the power change of the light signal L thereby narrowing the dynamic range. On the contrary, in the embodiment, even if each burst signal optical receiver 10 has a different property in regards to the relation between the gate—source voltage and the drain—source resistance of the transistor 13, the properties of the transistors 33 and 42 becomes the same as that of the transistor 13. Therefore, the gain can precisely change in accordance with the power change of the light signal.

(2) In the second conventional example, 3.3 V (TYP.) power supply, which is the main stream in the optical transmission products, cannot be used since the total of the input terminal voltage of the transform impedance amplifier 103, the operation voltage of the photodiode 101 and the operation voltage of the current mirror circuit 102 exceeds the value. On the contrary, in the embodiment, the current mirror circuit 102 is not necessary so that 3.3 V (TYP.) power supply can be used. Therefore, it is advantageous in regards to being economical and reducing the size.

(3) In the second conventional example, the current mirror circuit 102 is used so that high-speed operation is hard to be achieved. On the contrary, in the embodiment, the current mirror circuit 102 is not used so that high-speed operation is easily achieved.

Figure 3:
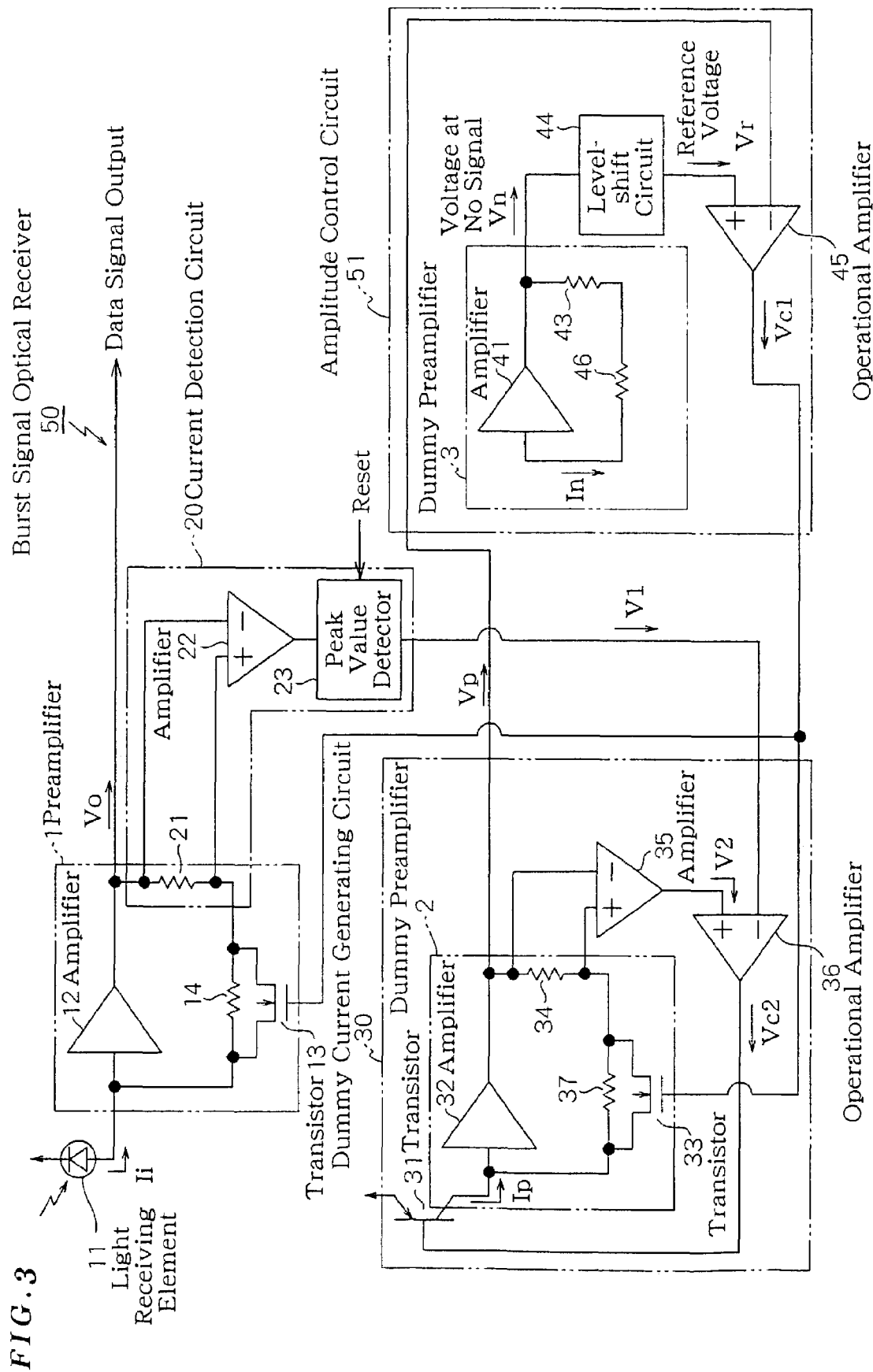
FIG. 3 is a circuit diagram showing a second embodiment of a burst signal optical receiver according to the present invention.

FIG. 3 is a circuit diagram showing a second embodiment of the burst signal optical receiver according to the present invention. In the followings, it will be described by referring to FIG. 3. The same numeral codes are applied to the configuration identical to that of the FIG. 1 and the description will be omitted.

An amplitude control circuit 51 in a burst signal optical receiver (an optical receiving device) 50 of the embodiment comprises: an amplifier (a third amplifier) 41, with the same I/O property as that of the amplifier 12, for converting a current In at the time of no signal into a voltage Vn at the time of no signal; a resistor 46 as a fixed feedback resistor being connected in between the I/O terminals of the amplifier 41; a resistor 43 with the same I/O property as that of the resistor 21, into which the current In at the time of no signal flows; a level-shift circuit 44 for shifting the voltage Vn at the time of no signal, which is converted by the amplifier 41, for a prescribed level so as to output it as the reference voltage Vr; and an operational amplifier 45 for outputting the control voltage Vc1 according to the difference between the reference voltage Vr outputted from the level-shift circuit 44 and the DC voltage Vp outputted from the amplifier 32.

In the burst signal optical receiver 50 according to the embodiment, the transistor 42 in the amplitude control circuit 40 of the first embodiment, shown in FIG. 1, is omitted when the stability against the changes in the power supply or the temperatures is eased.

Figure 4:
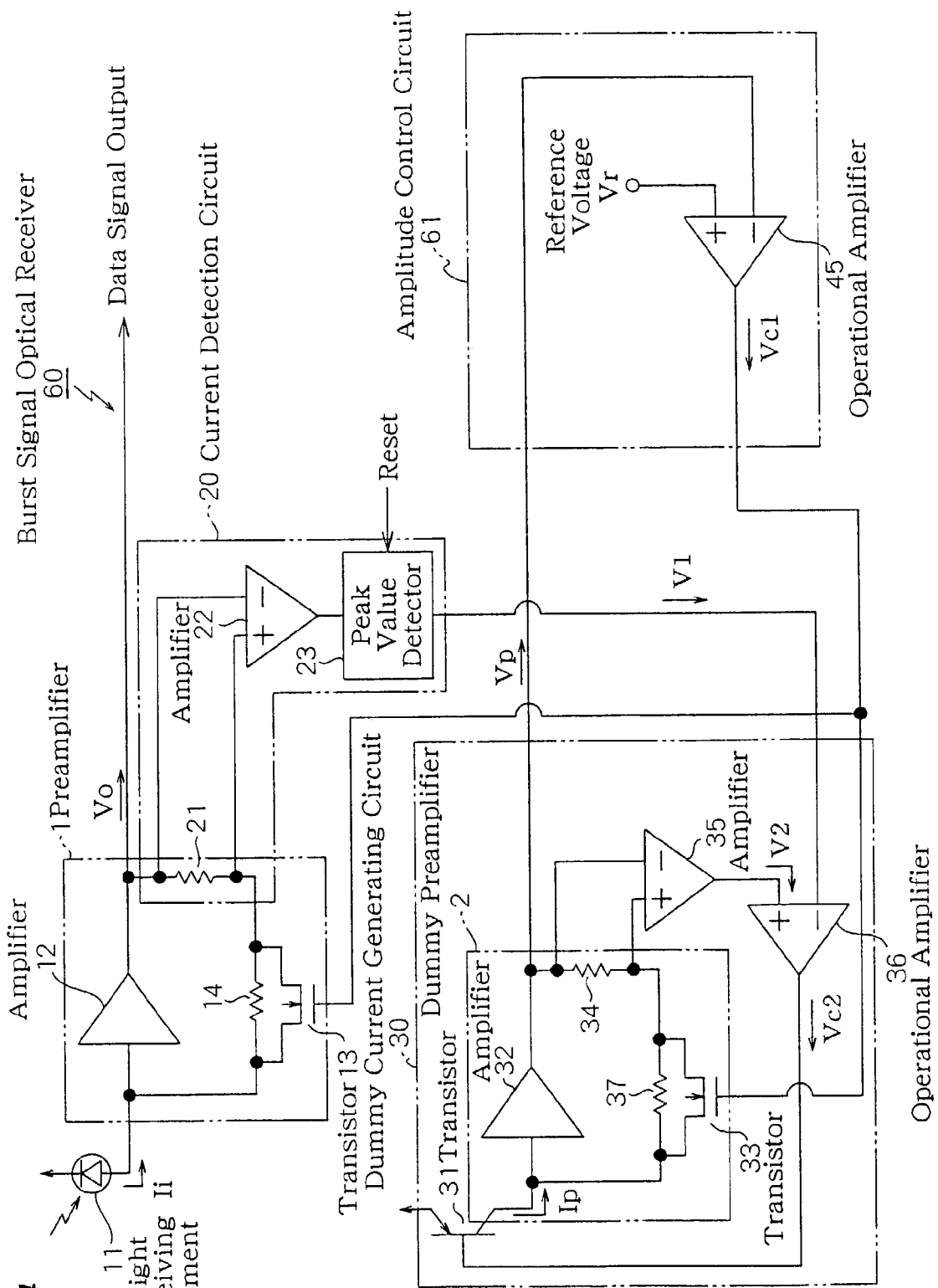
FIG. 4 is a circuit diagram showing a third embodiment of a burst signal optical receiver according to the present invention.
Figure 5:
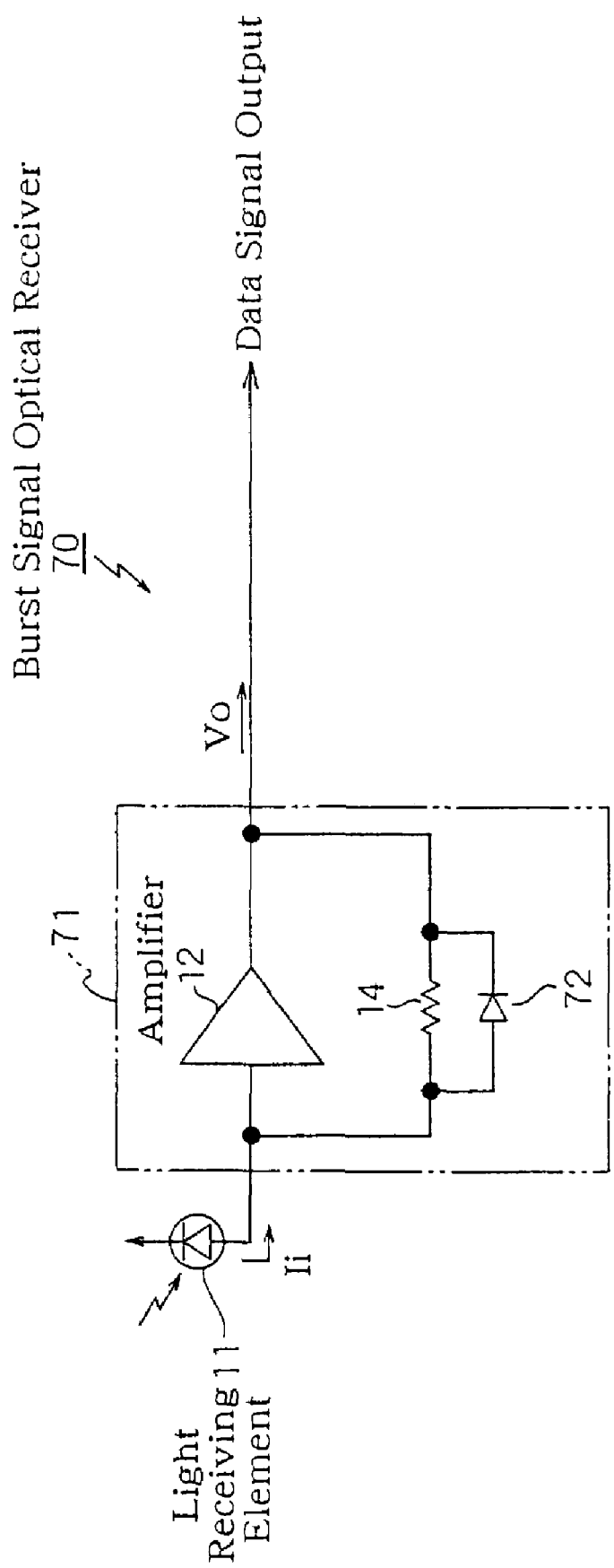
FIG. 5 is a circuit diagram showing a first conventional example of a burst signal optical receiver.
Figure 6:
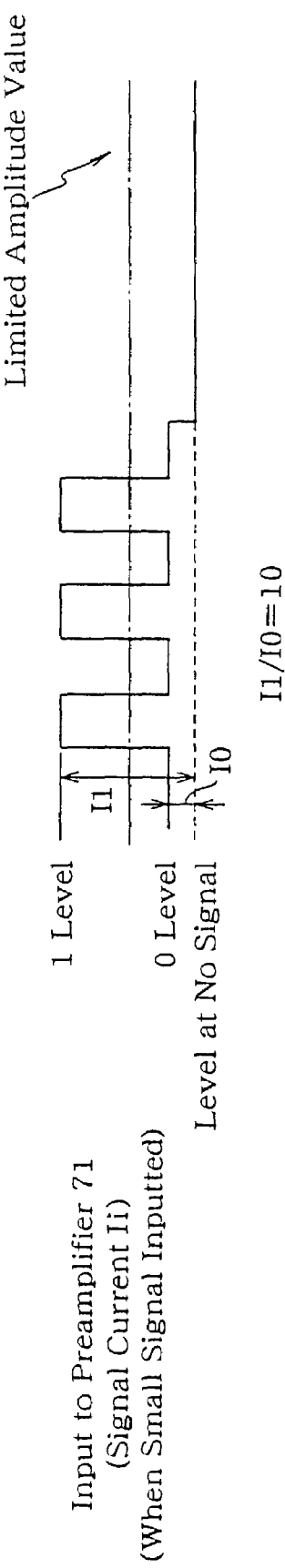
FIG. 6 are circuit diagrams showing an example of operation of the burst signal optical receiver shown in FIG. 5, where
Figure 7:
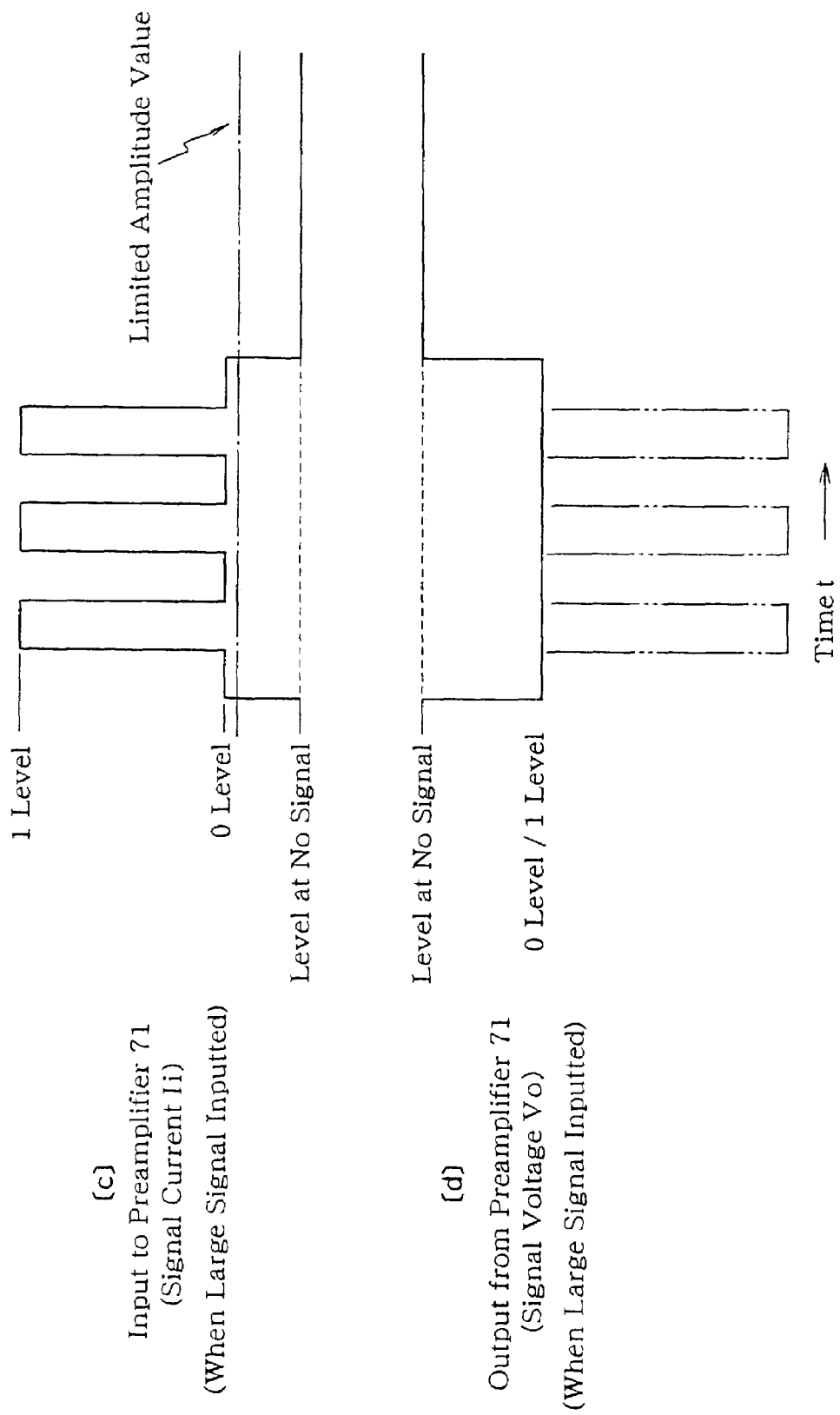
FIG. 7 are circuit diagrams showing another example of operation of the burst signal optical receiver shown in FIG. 5, where

FIG. 4 is a circuit diagram showing a third embodiment of a burst signal optical receiver according to the present invention. In the followings, it will be described by referring to FIG. 4. The same numeral codes are applied to the configuration identical to that of the FIG. 1 and the description will be omitted.

An amplitude control circuit 61 in a burst signal optical receiver (optical receiving device) 60 according to the embodiment comprises only an operational amplifier 45 which outputs the control voltage Vc1 according to the difference between the reference voltage Vr and the DC voltage Vp outputted from the amplifier 32.

In the burst signal optical receiver 60 according to the embodiment, the amplifier 41, the transistor 42, the resistor 43, the level-shift circuit 44 and the resistor 46 present in the amplitude control circuit 40 of the first embodiment shown in FIG. 1 are omitted. This can be achieved by fixedly supplying the reference voltage Vr determining the amplitude of the signal voltage Vo when the stability against-the changes in the power supply and the temperatures is eased.

Needless to say, the present invention is not limited to the first to third embodiments described above. For example, the preamplifier 1, the transistor 13, the current detection circuit 20, the dummy current generating circuit 30, the amplitude control circuit 40 and the like are merely examples and they may be replaced with other circuits and elements with the equivalent functions. Further, when a depression type is used for the transistors 13, 33 and 46, the resistors 14, 37 and 46 can be omitted. Furthermore, the resistor 21 which is provided in between the output side of the amplifier 12 and the transistor (resister) 14 in the embodiments may be provided in between the input side of the amplifier 12 and the resistor 14. It is also true for the resistors 34 and 43.

The optical receiving device according to the present invention comprises a first amplifier for converting the signal current outputted from the light receiving element into the signal voltage. In the optical receiving device, the dummy current generating unit outputs the DC voltage equal to the signal voltage which is obtained when the peak value of the signal current is converted by the first amplifier, and the amplitude control circuit controls the feedback resistance value of the first amplifier so as to reduce the difference between the DC voltage and the reference voltage. Thereby, it is possible to achieve the invariable amplitude of the signal voltage converted by the first amplifier even for a light signal with a wide range of power levels. At this time, the DC voltage outputted from the dummy current generating unit equals to the signal voltage which is obtained when the peak value of the signal current is converted by the first amplifier. Thus, it is extremely precise. Therefore, the amplitude of the signal voltage converted by the first amplifier can become invariable with high precision even for the light signal with a wide range of power levels. Thus, the first amplifier always operates in the linear region thereby widening the dynamic range.

Further, in the optical receiving device according to the present invention, the second amplifier, the second variable feedback resistor and the second resistor together forming the dummy current generating circuit have the same structure as that of the first amplifier, the first variable feedback resistor and the first resistor. Thus, the DC voltage outputted from the dummy current generating unit precisely coincides with the signal voltage which can be obtained when the pack value of the signal current is converted by the first amplifier. Therefore, the amplitude of the signal voltage converted by the first amplifier can become invariable with higher precision.

Furthermore, in the optical receiving device according to the present invention, the third amplifier, the third variable feedback resistor and the third resistor together forming the amplitude control generating circuit have the same structure as that of the first amplifier, the first variable feedback resistor and the first resistor. Thus, the voltage at the time of co signal obtained from the first amplifier precisely coincides with the voltage at the time of no signal which is obtained when the current at the time of no signal is converted by the first amplifier. Therefore, the reference voltage obtained by the amplitude control circuit becomes extremely precise. As a result, the amplitude of the signal voltage converted by the first amplifier can become invariable with further higher precision.

Moreover, with the optical receiving device according to the present invention, it is possible to easily achieve the parts with the same configuration and the property through forming the first amplifier, the first variable feedback resistor, the dummy current generating unit and the amplitude control circuit on the same semiconductor chip.

In short, in the present invention, the first amplifier is to always operate in the linear region so that the dynamic range can be widened while keeping the invariable extinction ratio against the changes in the input amplitude. That is, in the present invention, a dummy circuit equivalent to the preamplifier is used for obtaining the voltage equal to the peak value of the data signal current flowing in the light receiving element or to the voltage outputted from the preamplifier at the time of no signal. Thereby, differences in each element, the thermal property and the like are balanced out so that it becomes possible to operate stably against the changes in the power supply and the temperatures.

What is claimed is:

1. An optical receiving device comprising:
   a first amplifier for converting a signal current outputted from a light receiving element into a signal voltage;
   a first variable feedback resistor, being connected in between I/O terminals of the first amplifier, in which the resistance value changes in accordance with a first control voltage;
   a dummy current generating unit comprising a function of detecting the peak value of the signal current outputted from the light receiving element and outputting a DC voltage, the DC voltage being equal to the signal voltage obtained when a DC current equal to the peak value is converted by the first amplifier; and
   an amplitude control circuit for outputting the first control voltage to control the first variable feedback resistor so as to reduce the difference between the DC voltage outputted from the dummy current generating unit and a reference voltage.

2. The optical receiving device as claimed in claim 1, wherein the dummy current generating unit comprises: a current detection circuit for detecting the peak value of the signal current outputted from the light receiving element; and a dummy current generating circuit for generating a DC current equal to the peak value detected by the current detection circuit and for outputting a DC voltage equal to the signal voltage which is obtained when the DC current is converted by the first amplifier.

3. The optical receiving device as claimed in claim 2, wherein, as the first variable feedback resistor, a transistor is used in which the first control voltage is applied to a gate or a base.

4. The optical receiving device as claimed in claim 2, wherein the current detection circuit comprises:
   a first resistor into which a signal current outputted from the light receiving element flows; a first current detection amplifier for amplifying both-end voltage of the first resistor; and a peak value detector for detecting the peak value of the voltage amplified by the first current detection amplifier.

5. The optical receiving device as claimed in claim 4, wherein the dummy current generating current comprises:
   a variable current generator for outputting a current corresponding to a second control voltage as the DC current;
   a second amplifier with the same I/O property as that of the first amplifier for converting the DC current outputted from the variable current generator into a voltage and outputting it as the DC voltage;
   a second variable feedback resistor with the same I/O property as that of the first variable feedback resistor, in which the resistance value changes in accordance with a first control voltage by being connected in between I/O terminals of the second amplifier;
   a second resistor with the same I/O property as that of the first resistor, into which the DC current outputted from the variable current generator flows;
   a second current detection amplifier for amplifying both-end voltage of the second resistor; and
   an operational amplifier for outputting the second control voltage so as to reduce the difference between the voltage amplified by the second current detection amplifier and the peak value of the voltage detected by the peak value detector.

6. The optical receiving device as claimed in claim 5, wherein, as the second variable feedback resistor, a transistor is used in which the first control voltage is applied to a gate or a base.

7. The optical receiving device as claimed in claim 5, wherein, as the variable current generator, a transistor is used in which the second control voltage is applied to a gate or a base.

8. The optical receiving device as claimed in claim 5, wherein the amplitude control circuit comprises an operational amplifier for outputting the first control voltage so as to reduce the difference between the reference voltage and the DC voltage outputted from the second amplifier.

9. The optical receiving device as claimed in claim 1, wherein the amplitude control circuit comprises:
   a third amplifier, with the same I/O property as that of the first amplifier, for converting a current at the time of no signal into a voltage at the time of no signal;
   a third variable feedback resistor with the same I/O property as that of the first variable feedback resistor, in which the resistance value changes in accordance with a first control voltage by being connected in between I/O terminals of the third amplifier;
   a third resistor with the same I/O property as that of the first resistor, into which the current at the time of no signal flows;
   a level-shift circuit for shifting the voltage at the time of no signal, which is converted by the third amplifier, for a prescribed level so as to output it as the reference voltage; and
   an operational amplifier for outputting the first control voltage so as to reduce the difference between the reference voltage outputted from the level-shift circuit and the DC voltage outputted from the dummy current generating circuit.

10. The optical receiving device as claimed in claim 9, wherein, as the third variable feedback resistor, a transistor is used in which the first control voltage is applied to a gate or a base.

11. The optical receiving device as claimed in claim 1, wherein the amplitude control circuit comprises:
   a third amplifier, with the same I/O property as that of the first amplifier, for converting a current at the time of no signal into a voltage at the time of no signal;
   a fixed feedback resistor connected in between I/O terminals of the third amplifier;

a third resistor with the same I/O property as that of the first resistor, into which the current at the time of no signal flows;

a level-shift circuit for shifting the voltage at the time of no signal, which is converted by the third amplifier, for a prescribed level so as to output it as the reference voltage; and an operational amplifier for outputting the first control voltage so as to reduce the difference between the reference voltage outputted from the level-shift circuit and the DC voltage outputted from the dummy current generating circuit.

12. The optical receiving device as claimed in claim 1, wherein the first amplifier, the first variable feedback resistor, the dummy current generating unit and the amplitude control circuit are formed on the same semiconductor chip.

* * * * *